United States Patent
Lång et al.

(10) Patent No.: US 6,620,258 B1
(45) Date of Patent: Sep. 16, 2003

(54) METHOD FOR WASHING INSTRUMENTS USED IN SEMICONDUCTOR INDUSTRY

(75) Inventors: Kari Lång, Rovaniemi (FI); Pertti Mäntylä, Tampere (FI)

(73) Assignee: Kojair Tech Oy, Vilppula (FI)

( * ) Notice: Subject to any disclaimer, the term of this patent is extended or adjusted under 35 U.S.C. 154(b) by 0 days.

(21) Appl. No.: 09/575,614

(22) Filed: May 22, 2000

(30) Foreign Application Priority Data

May 21, 1999 (FI) .................................................. 991160

(51) Int. Cl.[7] .............................. B08B 3/00; B08B 5/00; B08B 7/04
(52) U.S. Cl. ............................ 134/21; 134/26; 134/30; 134/34; 134/37
(58) Field of Search .......................... 134/10, 21, 22.1, 134/26, 30, 37, 34

(56) References Cited

U.S. PATENT DOCUMENTS

| | | | |
|---|---|---|---|
| 4,474,199 A | 10/1984 | Blaudszun | |
| 5,027,841 A | 7/1991 | Breunsbach et al. | |
| 5,035,750 A | 7/1991 | Tada et al. | |
| 5,168,886 A | * 12/1992 | Thompson et al. | 134/153 |
| 5,201,960 A | 4/1993 | Starov | |
| 5,599,743 A | 2/1997 | Nakagawa et al. | |
| 5,682,913 A | 11/1997 | Lawson et al. | |
| 5,685,916 A | 11/1997 | Ye et al. | |
| 5,711,821 A | 1/1998 | Turner et al. | |
| 5,715,612 A | 2/1998 | Schwenkler | |
| 5,823,210 A | 10/1998 | Inada et al. | |
| 5,839,455 A | 11/1998 | Turner et al. | |
| 5,863,348 A | * 1/1999 | Smith et al. | 134/18 |

FOREIGN PATENT DOCUMENTS

| | | |
|---|---|---|
| DE | 235548 | 6/1911 |
| DE | 31 45 815 A1 | 6/1983 |
| EP | 0381372 | 8/1990 |
| EP | 0387001 | 9/1990 |
| EP | 0501492 A3 | 9/1992 |
| FI | 97920 | 11/1996 |

OTHER PUBLICATIONS

Handbook of Semiconductor Wafer Cleaning Technology, Noyes Publications, p. XIV, 1993.*

* cited by examiner

*Primary Examiner*—Alexander Markoff
(74) *Attorney, Agent, or Firm*—Young & Thompson

(57) ABSTRACT

The invention relates to a method for washing instruments used in semiconductor industry with an inflammable and/or explosive washing liquid. The instruments washed applying the method are placed into a substantially gas-tightly closed washing space (2), the air contained in the space being removed by supplying an inert gas or gas mixture to the space, while allowing, at the same time, the gas mixture containing air to be discharged from the washing space. The instruments (3) are washed by spraying them with the washing liquid. After the washing, the washing liquid is removed from the washing space and the gas mixture generated in the washing space which contains vapours from the washing liquid is removed by supplying an inert gas/gas mixture to the washing space and discharging, at the same time, the gas mixture containing washing liquid vapours out of the washing space. The invention further relates to an equipment comprising a substantially gas-tightly closed washing space (2) where the instruments (3) to be washed are placed for the washing. The equipment also includes means (4), (7) for spraying washing liquid onto the instruments and means (10 to 12) for supplying an inert gas/gas mixture to the washing space. The equipment further comprises means for removing a gaseous mixture from the washing space, and control means for controlling the equipment.

4 Claims, 1 Drawing Sheet

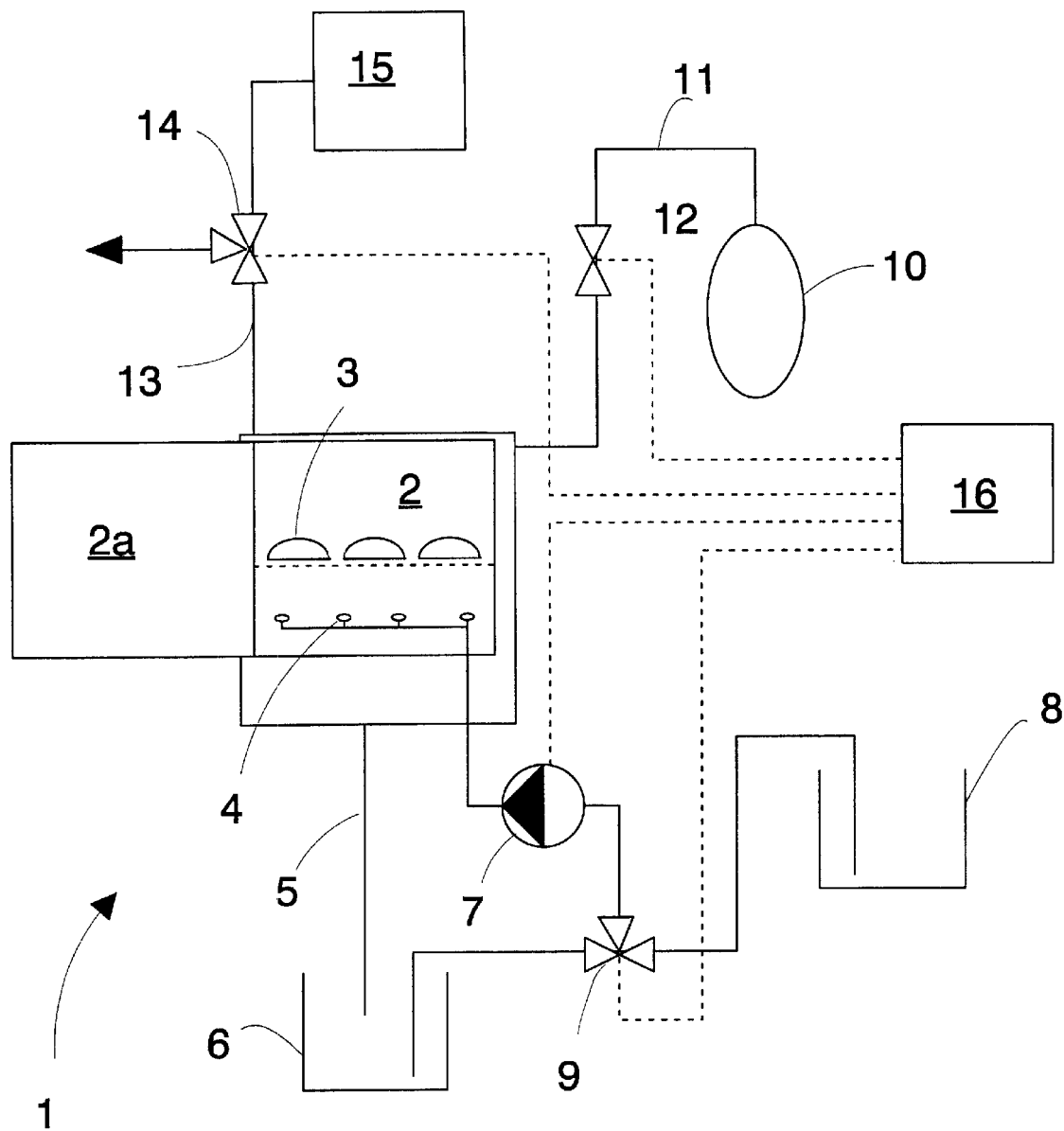
FIG.

METHOD FOR WASHING INSTRUMENTS USED IN SEMICONDUCTOR INDUSTRY

BACKGROUND OF THE INVENTION

The invention relates to a method for washing instruments used in semiconductor industry with an inflammable and/or explosive washing liquid.

The invention also relates to an equipment for washing instruments used in semiconductor industry with an inflammable and/or explosive washing liquid.

In semiconductor industry, light-sensitive materials, or resists, are used in various manufacturing processes. In some processes, specific instruments, such as resist cups and the like, are used when such materials are handled, and therefore some material is left on the surface of the instruments. Before the instruments can be used again, the material residuals must be removed. At present, the instruments are cleaned by washing them with a suitable solvent in a commonly used fume cupboard, the solvent vapours generated in the cabinet being exhausted with an exhauster and the used liquiform solvent recovered. A problem with the current process is that ventilation for the removal of the solvent vapours is rather difficult and expensive to arrange, and solvent vapours released into the ambient atmosphere cause environmental problems. A further problem is high consumption of the solvent used as washing liquid per unit to be washed.

SUMMARY OF THE INVENTION

An object of the present invention is to provide a method and an equipment which allow an automated washing of these instruments which is both convenient and safe. The method of the invention is characterized in that the instruments to be washed are placed into a substantially gas-tightly closed washing space; that the air in the enclosed washing space is removed from the washing space by supplying an inert gas or gas mixture to the space, while allowing, at the same time, a gas mixture containing air in the washing space to be discharged from the washing space; that the instruments are washed by spraying them with the washing liquid, the washing liquid sprayed into the washing space being removed from the washing space; and that after the washing is completed, the gas mixture containing washing liquid vapour that is generated in the washing space is removed from the washing space by supplying an inert gas/gas mixture to the washing space and by discharging, at the same time, the gas mixture containing washing liquid vapour from the washing space.

Further, the equipment of the invention is characterized in that the equipment comprises a substantially gas-tightly closed washing space where the instruments to be washed are placed for the washing; means for spraying washing liquid onto the instruments; means for supplying an inert gas/gas mixture to the washing space; means for removing a gaseous mixture that is in the washing space from the washing space; and control means for controlling the equipment.

A basic idea of the invention is that the instruments to be washed are washed with an automated washing equipment, in a substantially gas-tightly closed washing space included in the equipment, the instruments to be washed being cleaned by flushing them with a suitable liquid. Another essential idea of the invention is that when the units to be washed are placed into the washing space, which is then closed, the air in the space is removed before the washing begins by supplying an inert gas or gas mixture, preferably nitrogen, to the space, thus eliminating the risk of fire or explosion. A yet further essential idea of the invention is that after the washing is completed, the solvent vapours in the washing space are removed by supplying again an inert gas or gas mixture to the space, thereby allowing solvent emissions to be recovered for further processing.

An advantage of the invention is that the risk of fire or explosion can be avoided because there is no oxygen in the washing space that would cause a fire or an explosion. Moreover, the quantity of solvent vapour emissions per wash is low because it depends on the quantity of vapours that can evaporate into the washing space in different circumstances. A further advantage is that when the solvent vapours are removed from the washing space to recovery by supplying inert gas to the washing space, the washing space can then be safely opened without any harmful vapours or gases being released into the atmosphere.

BRIEF DESCRIPTION OF THE DRAWINGS

The invention will be described in greater detail with reference to the accompanying FIGURE which is a schematic view of the equipment of the invention.

DESCRIPTION OF THE PREFERRED EMBODIMENTS

The FIGURE is a schematic view of the equipment of the invention. The equipment comprises an actual washing device 1 comprising a washing space 2 for washing instruments 3. The instruments to be washed can be placed into the washing space 2 either in a separate basket or on a wire tray, or other suitable holder, included in the washing space 2. The washing space 2 further comprises nozzles 4 which spray the solvent, or the like, used as a detergent onto the surface of the instruments to be washed in order to clean them. The bottom of the washing space 2 forms a basin into which the sprayed washing liquid collects, and at the bottom of the basin there is a duct 5 through which the washing liquid can be supplied to a recycle container 6. The equipment further comprises a pump 7 for pumping the washing liquid into the nozzles 4. In addition, the equipment comprises a feed container 8 where new, unused washing liquid is kept and from where it can be supplied to the pump 7. Depending on the washing phase, either used washing liquid from the recycle container 6 or clean washing liquid from the feed container 8 is supplied to the pump 7, the duct for supplying the washing liquid to the pump 7 being selected by means of a valve 9. In the FIGURE, the washing liquid container 6 and 8 are shown as open receptacles, which is only for the sake of clarity. In practice, inflammable and explosive washing liquid can naturally only be stored in closed containers which do not allow the washing liquid to evaporate into ambient air.

The equipment may comprise a gas container 10, such as a gas cylinder, or the like, that can be connected to the washing space 2 via a gas supply duct 11 provided with a valve 12. Instead of the gas container, in a factory or laboratory gas can be supplied from a fixed gas system, if one is available. On the opposite side of the washing space with respect to the gas supply duct 11, there is a gas removal duct 13 which can be connected through a valve 14 either to a removal duct arranged for organic materials or to a recovery device 15, for example, at the factory or laboratory. The gas container 10 contains an inert gas or gas mixture, a most preferred one of which is common nitrogen. The equipment further comprises control means, such as a control unit 16, which controls the pump and the valves as well as other functions of the equipment according to predetermined settings.

The process for washing the units 3 to be washed with the equipment proceeds as follows. The units 3 to be washed are placed into the washing space 2 in a position which allows washing liquid to flow from the units to the bottom of the washing space 2. The washing space 2 is provided with a door 2a, arranged either at the side of the washing space, as in the example, or on top of it, which is tightly closed, an enclosed washing space being thereby formed. Inert gas, such as nitrogen, contained in the gas container 10 is supplied to the washing space 2, whereby the gas that flows into the washing space pushes out the plain air the space contains. The gas removal duct 13 can in this case be connected to the atmosphere because all the gas coming out of the duct can be discharged directly into the atmosphere without causing any harm or damage.

When the washing space 2 has been flushed so that it no longer contains any oxygenous air but only inert gas supplied to the space, the gas supply and removal ducts 11 and 13 are closed. The pump 7 is then switched on to pump used washing liquid from the recycle container 6 through the nozzles 4 onto the instruments to be washed to prewash them, i.e. to detach and remove materials from the instruments. If desired, it is also possible to use several recycle containers to collect washing liquids of varying degrees of dirtiness from the different washing phases, the dirtiest liquid being used for the first wash, after which a less dirty washing liquid may be used in the subsequent wash, etc. An essential aspect is that there is still solvent ability left in a liquid containing resists or similar impurities, therefore it can very well be used for dissolving and removing a material so that no solid material is left on the surface of the instruments to be washed. In the last washing phase the pump 7 is connected via the valve 9 to the feed container 8 of clean washing liquid, the last flush being carried out using fully unused, new washing liquid in order to remove even the last residuals from the instruments to be washed. The new washing liquid is usually not recycled in the flushing, but it is collected into the recycle container 6. However, the new washing liquid can be recycled for example through the pipes, valves and the pump to clean off various residuals from them as thoroughly as possible. Instead of the above mentioned container, new washing liquid can naturally be also taken directly from the washing liquid system of the factory or laboratory, provided that one is available, the feed container 8 then supplying clean washing liquid to the entire system.

After the washing is completed and the supply of washing liquid through the nozzles has stopped, the gas supply duct 11 is again opened by means of the valve 12 to supply inert gas to the washing space. Since the washing space contains a mixture of the washing liquid vapour evaporated from the washing liquid and the inert gas, the gas removal duct 13 is connected through the valve 14 to the recovery device 15, for example. The inert gas or gas mixture supplied to the washing space pushes the mixture containing the washing liquid vapour in the washing space 2 into the duct 13 and further to the recovery device 15. When the washing space again contains only an inert gas or gas mixture, the gas supply and removal ducts 11 and 13 are closed, and the door 2a of the washing space 2 can be opened and the washed instruments removed from the washing equipment.

The gas recovery device 15 may consist of a container alone, or it may comprise for example a compressor or other devices for compressing the gas removed from the washing space, etc. Various other techniques fully known per se can also be used to extract solvent vapours from the gas, and the recovered solvent vapour can be liquefied and returned for re-use. An essential aspect is that the mixture which is removed from the washing space 2 and which contains washing liquid vapour is recovered and not released into the atmosphere, whereby for example a mixture recovered at suitable intervals can be further processed in a suitable manner for example by condensing the washing liquid vapours into a liquid to be returned for re-use.

The above description and the related drawing only illustrate an example of the invention, the invention not being in any way restricted to the example. The essential idea is that when washing liquids involving a risk of fire or explosion are used, the washing takes place in a closed space where an inert gas or gas mixture is first used to flush away the gas mixture containing oxygen so as to eliminate the risk and, after the washing, the mixture containing washing liquid vapour is flushed and recovered so that when the washing space is opened after the washing, the inert gas or gas mixture in the space can mix with the ambient air without any risk or damage being caused.

What is claimed is:

1. A method for washing instruments used in semiconductor industry with an inflammable and/or explosive washing fluid, comprising the steps of:

placing the instruments to be washed into a substantially gas-tightly closed washing space (2);

removing air from the closed washing space (2) by supplying an inert gas or gas mixture to the washing space while allowing, at the same time, a gas mixture containing air in the washing space to be discharged from the washing space;

first washing the instruments (3) by spraying them with the washing fluid that has been previously used for washing;

second washing the instruments by spraying them with the washing fluid that has not been previously used for washing;

removing the washing fluid from the washing space; and after the washing is completed, removing a gas mixture containing washing fluid vapor that is generated in the washing space from the washing space by supplying an inert gas/gas mixture to the washing space and by discharging, at the same time, the gas mixture containing the washing fluid vapor from the washing space (2).

2. The method according to claim 1, wherein the gas used is nitrogen.

3. The method according to claim 1, wherein the gas mixture containing the washing fluid vapor that is removed from the washing space is supplied from the washing space to a recovery device (15) for recovering the vapor.

4. The method of claim 1, further comprising the steps of providing to the washing space, through a common valve, the washing fluid that has been previously used and the washing fluid that has not been previously used, and selectively controlling operation of the valve to supply the appropriate washing fluid during the first and second washing steps.

* * * * *